(12) United States Patent
Baek et al.

(10) Patent No.: US 9,419,242 B2
(45) Date of Patent: Aug. 16, 2016

(54) ORGANIC WHITE LIGHT EMITTING DISPLAY APPARATUS

(71) Applicant: Samsung Display Co., Ltd., Yongin, Gyeonggi-Do (KR)

(72) Inventors: Soo-Min Baek, Yongin (KR); Min-Woo Kim, Yongin (KR); Il-Nam Kim, Yongin (KR); Jae-Ik Lim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 0 days.

(21) Appl. No.: 14/222,417

(22) Filed: Mar. 21, 2014

(65) Prior Publication Data

US 2014/0353630 A1 Dec. 4, 2014

(30) Foreign Application Priority Data

May 31, 2013 (KR) .......................... 10-2013-0063075

(51) Int. Cl.
| | |
|---|---|
| H01L 29/08 | (2006.01) |
| H01L 35/24 | (2006.01) |
| H01L 51/00 | (2006.01) |
| H01L 51/52 | (2006.01) |
| H01L 27/32 | (2006.01) |

(52) U.S. Cl.
CPC ............ *H01L 51/525* (2013.01); *H01L 27/322* (2013.01); *H01L 27/3246* (2013.01); *H01L 51/5262* (2013.01)

(58) Field of Classification Search
USPC ........................... 257/40; 313/506; 315/169.3
See application file for complete search history.

(56) References Cited

U.S. PATENT DOCUMENTS

| | | | |
|---|---|---|---|
| 7,091,658 B2 | 8/2006 | Ito et al. | |
| 7,791,268 B2 | 9/2010 | Jung et al. | |
| 7,812,523 B2 * | 10/2010 | Jung et al. | ...................... 313/506 |
| 8,354,980 B2 * | 1/2013 | Kwak | .............................. 345/76 |
| 9,029,838 B2 | 5/2015 | Lim et al. | |
| 2007/0108893 A1 | 5/2007 | Lee et al. | |
| 2007/0108899 A1 * | 5/2007 | Jung et al. | ...................... 313/506 |
| 2009/0322657 A1 | 12/2009 | Na et al. | |
| 2010/0097295 A1 * | 4/2010 | Kwak | .................... H01L 27/322 345/32 |
| 2014/0070175 A1 * | 3/2014 | Kang | .............................. 257/40 |

(Continued)

FOREIGN PATENT DOCUMENTS

| | | |
|---|---|---|
| KR | 10-2004-0051072 A | 6/2004 |
| KR | 10-2007-0048957 A | 5/2007 |
| KR | 10-2007-0087773 A | 8/2007 |

(Continued)

*Primary Examiner* — Telly Green
(74) *Attorney, Agent, or Firm* — Knobbe Martens Olson & Bear LLP

(57) ABSTRACT

Disclosed is an organic white light emitting display apparatus. The organic white light emitting device includes a first substrate including a first sub-pixel area, a second sub-pixel area, a third sub-pixel area, and an organic light emitting device (OLED) that includes a first electrode, a second electrode, and an organic white light emitting layer interposed between the first and second electrodes, and emits whit light for respective sub-pixel areas, a second substrate including first, second, and third color filters of different colors formed on positions corresponding to the respective sub-pixel areas, the second substrate being arranged to face the first substrate, and a partition wall that is extended to an area between neighboring color filters among the color filters and partitions the sub-pixel areas, the partition wall being formed on the first substrate.

22 Claims, 3 Drawing Sheets

(56) References Cited

U.S. PATENT DOCUMENTS

2014/0203245 A1* 7/2014 Gupta et al. .................... 257/40
2014/0291622 A1* 10/2014 Wang .................. H01L 51/5281
                                                              257/40

FOREIGN PATENT DOCUMENTS

| KR | 10-2010-0001597 A | 1/2010 |
| KR | 10-2013-0007421 | 1/2013 |

* cited by examiner

ORGANIC WHITE LIGHT EMITTING DISPLAY APPARATUS

CROSS-REFERENCE TO RELATED APPLICATIONS

This application claims the benefit of Korean Patent Application No. 10-2013-0063075, filed on May 31, 2013, in the Korean Intellectual Property Office, the disclosure of which is incorporated herein in its entirety by reference.

BACKGROUND

1. Field

The present embodiments relate to an organic white light emitting display apparatus.

2. Description of the Related Technology

Flat display apparatuses such as a plasma display plane (PDP), liquid crystal display apparatuses, and organic electroluminescence display apparatuses are attracting considerable attention.

The liquid crystal display apparatus is not a self-luminous device, but a light-receiving device, and thus there is a limit in brightness, contrast, a vision angle, and forming a large size device. The PDP is a self-luminous device, but the PDP is heavier than other flat display apparatuses, consumption power is high, and the manufacturing method is complicated.

In contrast, the organic electroluminescence display apparatus is a self-luminous device and thus a superior vision angle and contrast are shown, and since a backlight is not necessary, a light and thin type is possible and less consumption power is used compared to other display apparatuses. Furthermore, a low DC voltage operation is possible, response speed is high, the temperature range for use is wide, the manufacturing method is simple and inexpensive, and it is resistant to external impacts.

In the organic electroluminescence display apparatus, one unit pixel for expressing natural color is composed of sub-pixels of red R, green G, and blue B, and the sub-pixels may include an organic light emitting layer that emits white light. When the organic electroluminescence display apparatus is a top emission type, a gap between the organic light emitting layer that emits light and a color filter is large compared to a bottom emission type, and thus there is a limit in implementing desired color.

SUMMARY

The present embodiments provide a top emission type organic white light emitting display apparatus.

According to an aspect of the present embodiments, there is provided an organic white light emitting display apparatus including: a first substrate including a first sub-pixel area, a second sub-pixel area, a third sub-pixel area, wherein an organic light emitting device (OLED) is formed in each sub-pixel area, the OLED includes a first electrode, a second electrode, and an organic white light emitting layer interposed between the first and second electrodes and emits white light; a second substrate facing the first substrate and including first, second, and third color filters of different colors formed on positions corresponding to the respective sub-pixel areas; and a partition wall formed on the first substrate, extending to an area between neighboring color filters among the color filters and partitioning the sub-pixel areas.

The second electrode of the OLED may be formed on the partition wall.

The second substrate may include a black matrix formed between the neighboring color filters.

The partition wall may contain a pigment of a color other than colors of color filters arranged at both sides on the basis of the partition wall.

A partition wall arranged between the first color filter and the second color filter may contain a pigment of the third color, a partition wall arranged between the second color filter and the third color filter may contain a pigment of the first color, and a partition wall arranged between the third color filter and the first color filter may contain a pigment of the second color.

The first color may be red, the second color may be green, and the third color may be blue.

The organic white light emitting display apparatus of claim 1 may further include: a thin film transistor (TFT) formed on the first substrate; a planarization layer formed on the TFT; a first pixel defined layer formed on the planarization layer and including an inclined surface and an opening that defines the sub-pixel area; and a second pixel defined layer formed on the first pixel defined layer, wherein a peripheral part of the first electrode of the OLED is formed on the inclined surface of the first pixel defined layer.

The partition wall may be formed on the second pixel defined layer.

The partition wall and the second pixel defined layer may be integrally formed.

The second pixel defined layer may cover the first electrode formed on the inclined surface of the first pixel defined layer.

According to another aspect of the present embodiments, there is provided an organic white light emitting display apparatus including: a first substrate including red, green, and blue sub-pixel areas; a second substrate facing the first substrate and including red, green, and blue color filters formed at positions corresponding to the sub-pixel areas; a pixel defined layer formed on the first substrate, the pixel defined layer defines the sub-pixel areas; a partition wall formed on the pixel defined layer, extending to an area between neighboring color filters among the color filters and partitioning the sub-pixel areas; a first electrode formed on the first substrate and positioned for each of the sub-pixel areas; an intermediate layer formed on the first electrode and including an organic white light emitting layer; and a second electrode formed on the intermediate layer and the partition wall.

The partition wall may contain a pigment of a color other than colors of color filters arranged at both sides on the basis of the partition wall.

A partition wall extended to an area between the red color filter and the green color filter may contain a blue pigment, a partition wall extended to an area between the green color filter and the blue color filter may contain a red pigment, and a partition wall extended to an area between the blue color filter and the red color filter may contain a green pigment.

The organic white light emitting display apparatus of claim 11 may further include: a thin film transistor (TFT) formed on the first substrate; a planarization layer formed on the TFT; a first pixel defined layer formed on the planarization layer and including an inclined surface and an opening that defines the sub-pixel area; and a second pixel defined layer formed on the first pixel defined layer, wherein a peripheral part of the first electrode of an organic light emitting device is formed on the inclined surface of the first pixel defined layer.

The first electrode may include reflective metal.

The partition wall may be formed on the second pixel defined layer.

The partition wall and the second pixel defined layer may be integrally formed.

The second substrate may further include a black matrix formed in an area between the neighboring color filters.

An upper part of the partition wall may be arranged to correspond to the black matrix.

The second electrode may have translucency and reflexibility that reflects at least some of light, which is emitted toward the partition wall among white light emitted from the intermediate layer, toward the second substrate.

BRIEF DESCRIPTION OF THE DRAWINGS

The above and other features and advantages of the present embodiments will become more apparent by describing in detail example embodiments thereof with reference to the attached drawings in which.

DETAILED DESCRIPTION

Figure 1:
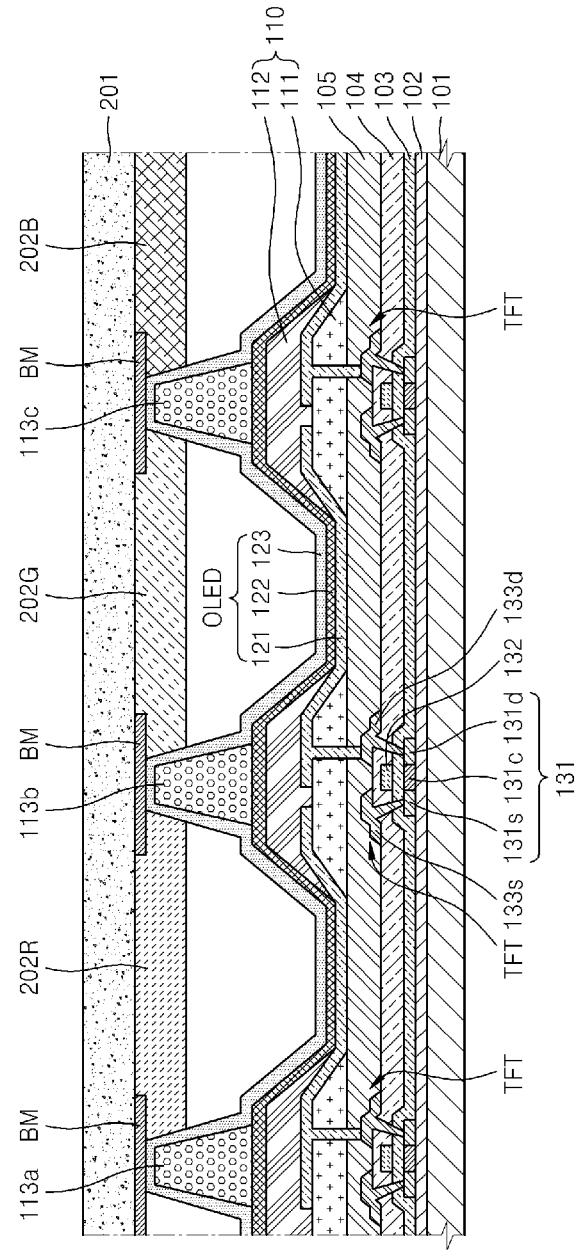
FIG. 1 is a cross-sectional diagram schematically illustrating an organic white light emitting display apparatus according to an embodiment.

As used herein, the term "and/or" includes any and all combinations of one or more of the associated listed items.

The present embodiments will now be described more fully with reference to the accompanying drawings, in which example embodiments are shown. The embodiments may, however, be embodied in many different forms and should not be construed as being limited to the embodiments set forth herein; rather, these embodiments are provided so that this disclosure will be thorough and complete, and will fully convey the concept of the embodiments to those skilled in the art. In the drawings, the thicknesses of layers and regions are exaggerated for clarity. Terms such as "including," "having," "consist of" may be intended to indicate a plurality of components unless the terms are used with the term "only."

It will also be understood that when a layer is referred to as being "on" another layer or substrate, it can be directly on the other layer or substrate, or intervening layers may also be present. Like reference numerals in the drawings denote like elements, and thus their description will be omitted.

Figure 2:
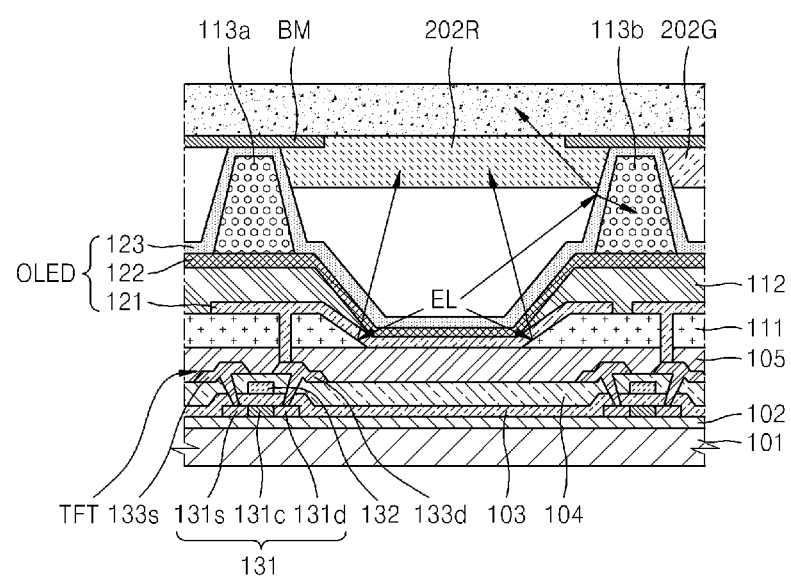
FIG. 2 is a cross-sectional diagram illustrating one sub-pixel area of FIG. 1.

FIG. 1 is a cross-sectional diagram schematically illustrating an organic white light emitting display apparatus (hereinafter, referred to as "display apparatus") according to an embodiment, and FIG. 2 is a cross-sectional diagram illustrating one sub-pixel area of FIG. 1.

A first substrate 101 includes a plurality of sub-pixel areas. For example, the first substrate 101 may include a first sub-pixel area (red), a second sub-pixel area (green), and a third sub-pixel area (blue), and an organic light emitting device (OLED) that emits white light is formed in each sub-pixel area.

A second substrate 210 is arranged to face the first substrate 101, and the second substrate 201 includes color filters 202R, 202G, and 202B formed at positions corresponding to respective sub-pixel areas, and a black matrix formed between the color filters 202R, 202G, and 202B. The display apparatus according to an embodiment is a top emission type, and white light emitted from each sub-pixel area emits red light, green light, and blue light as the white light passes through the color filters 202R, 202G, and 202B formed on the second substrate 201.

Partition walls 113a, 113b, and 113c, which are extended to areas between neighboring color filters 202R, 202G, and 202B and partition the sub-pixel areas, are formed on the first substrate 101. The partition walls 113a, 113b, and 113c may be formed to cover one sub-pixel area entirely or partly.

Color purity at each sub-pixel area may be improved by the partition walls 113a, 113b, and 113c. As a comparative example of the present embodiments, a front-emitting display apparatus without the partition walls 113a, 113b, and 113c that partition respective sub-pixel areas will be described below.

In the display apparatus according to the comparative example of the present embodiments, it is assumed that power is supplied only to an OLED formed at a position corresponding to the green color filter 202G in order to view green light. In this case, there is a gap between the first substrate and the second substrate, and thus white light emitted from the OLED emits toward all directions. A part of the emitted light emits toward the red color filter 202R and the blue color filter 202B included in pixels adjacent to the green pixel. Hence, a user views red and blue light as well as green light, and thus it is impossible to display pure green light. Color purity of green is deteriorated.

However, according to an embodiment, the partition walls 113a, 113b, and 113c that partition adjacent sub-pixel areas are provided, and thus the mixture of colors other than the desired colors may be prevented.

Hereinafter, the structure of the display apparatus of the present embodiments will be described with reference to FIGS. 1 and 2.

The first substrate 101 may be made of glass or plastic. For example, the first substrate 101 may comprise an organic insulation material selected from a group composed of polyethersulphone (PES), polyacrylate (PAR), polyetherimide (PEI), polyethyelenen napthalate (PEN), polyethyelene-terepthalate (PET), polyphenylene sulphide (PPS), polyallylate, polyimide, polycarbonate (PC), cellulose triacetate (TAC), and cellulose acetate propionate (CAP) which are insulating organic matters.

The display apparatus according to the present embodiments includes a top emission type display apparatus, and thus the first substrate 101 may comprise one or more selected from a group composed of iron, chrome, manganese, nickel, titanium, molybdenum, stainless steel (SUS), Invar alloy, Inconel alloy, and Kovar alloy, but the present embodiments are not limited thereto.

A buffer layer 102 may be formed on the first substrate 101. The buffer layer 102 may comprise one of a silicon oxide film, a silicon nitride film and multiple films thereof.

A thin film transistor (TFT) is formed on the buffer layer 102. At least one TFT is formed for each pixel and is electrically connected to the OLED to operate as a driving circuit unit. The TFT broadly includes an active layer 131, a gate electrode 132, a source electrode 133s, and a drain electrode 133d.

The active layer 131 may comprise an inorganic semiconductor such as amorphous silicon or poly silicon, or an organic semiconductor, and includes a source area 131s, a drain area 131d, and a channel area 131c. The source and drain areas 131s and 131d may be formed by doping impurities to the active layer 131 comprising amorphous silicon or poly silicon. If doped by group III elements such as boron B, a p-type semiconductor may be formed, and if doped by group V elements such as nitrogen N, an n-type semiconductor may be formed.

A gate insulation layer 103 is formed on the upper part of the active layer 131, and the gate electrode 132 is formed on a predetermined area of the upper part of the gate insulation layer 103. The gate insulation layer 103 is used to insulate the active layer 131 and the gate electrode 132, and may comprise organic material or inorganic material such as silicon oxide and silicon nitride.

The gate electrode 132 may comprise metal such as Au, Ag, Cu, Ni, Pt, Pd, Al, and Mo, or a metal alloy such as an Al:Nd alloy and a Mo:W alloy, but the present embodiments are not limited thereto, and various materials may be used in consideration of coherence with an adjacent layer, flatness of a stacked layer, electric resistance, formability, etc.

An interlayer insulation film 104 including a contact hole is formed on the upper part of the gate electrode 132. The source electrode 133s and the drain electrode 133d are formed to contact the source area and the drain area of each active layer 131 through the contact hole. The source electrode 133s and the drain electrode 133d may comprise metal such as Au, Ag, Cu, Ni, Pt, Pd, Al, and Mo, or a metal alloy such as an Al:Nd alloy and a Mo:W alloy, but the present embodiments are not limited thereto.

The formed TFT is covered and protected by a planarization layer 105. The planarization layer 105 may comprise an inorganic insulation film and/or an organic insulation film.

Thereafter, a pixel defined layer 110 made of insulating materials is formed on the planarization layer. The OLED including a first electrode 121, an intermediate layer 122, and a second electrode 123 is formed on the sub-pixel area defined by the pixel-defined layer 110. Here, the first electrode, e.g., a peripheral part of the first electrode, may include an inclined surface so that light, which is emitted in a horizontal direction, e.g., a right and left direction of the display apparatus of FIG. 2, among white light emitted from the intermediate layer 122, may be reflected to be emitted toward the second substrate 201.

The pixel defined layer may include a first pixel defined layer 111 and a second pixel defined layer 112 formed on the first pixel defined layer 111, and the first electrode 121 may be formed between the first pixel defined layer 111 and the second pixel defined layer 112. The first pixel defined layer 111 and the second pixel defined layer 112 may comprise one or more organic materials selected from a group composed of polyimide, polyamide, acrylic resin, benzocyclobutene, and phenol resin.

First, an opening is formed so that the peripheral part of the first pixel defined layer 111 may have an inclined surface, and the first electrode 121 is formed on the opening and the inclined surface of the first pixel defined layer 111. The first electrode 121 may be electrically connected to the drain electrode 133d of the TFT through the contact hole formed at the edge of the first pixel defined layer 111.

As illustrated in FIG. 2, as the peripheral part of the first electrode 121 is formed on the inclined surface of the first pixel defined layer 111, the first electrode 121 may also include an inclined surface having a predetermined angle toward the first substrate 101. The first electrode is a reflective electrode, and may contain reflective metal comprising Ag, Mg, Al, Pt, Pd, Au, Ni, Nd, Ir, Cr, or an alloy thereof, etc.

Hence, light, which is emitted in a horizontal direction, e.g., toward the first pixel defined layer 111, among white light emitted from the intermediate layer 122, is reflected to be emitted toward the second substrate 201, and thus optical efficiency may be improved.

The second pixel defined layer 112 including an opening, which has substantially the same shape as that of the opening of the first pixel defined layer, is formed on the first electrode 121, and the intermediate layer 122 including an organic white light emitting layer is formed on the second pixel defined layer 112.

When the organic white light emitting layer of the intermediate layer 122 comprises low molecular organic materials, a hole transport layer, a hole injection layer, an electron transport layer, an electron injection layer, etc. may be stacked. Furthermore, various other layers may be stacked as necessary. Alternatively, when the organic white light emitting layer of the intermediate layer 122 comprises high molecular organic materials, only the hole transport layer may be included on the basis of the organic white light emitting layer.

The partition walls 113a, 113b, and 113c are formed on the second pixel defined layer 112, and as described above, the partition walls 113a, 113b, and 113c are interposed between areas between the color filters 202R, 202G, and 202B, e.g., neighboring sub-pixel areas, so as to spatially separate the pixels and prevent light emitted from each sub-pixel area from being emitted toward adjacent sub-pixel areas. The partition walls 113a, 113b, and 113c may comprise one or organic materials selected from a group composed of polyimide, polyamide, acrylic resin, benzocyclobutene, and phenol resin.

A second electrode 123 is formed on the partition walls 113a, 113b, and 113c. The second electrode 123 is a light-transmitting electrode and may comprise a transparent conductive layer comprising ITO, IZO, ZnO or In2O3, or thin metal such as a Mg:Ag alloy. In particular, When the second electrode 123 comprises a thin Mg:Ag alloy, the second electrode 123 may have translucency and reflect light, and thus as illustrated in FIG. 2, part of light emitted toward the partition walls 113a, 113b, and 113c among light emitted from the organic white light emitting layer is reflected in the second electrode 123 to be emitted toward the color filters 202R, 202G, and 202B, thereby enhancing light collecting efficiency.

A part of the remaining light that is emitted toward the partition walls 113a, 113b, and 113c among light emitted from the organic white light emitting layer is not reflected by the second electrode 123, and may be absorbed in the partition walls 113a, 113b, and 113c. Here, in order to block light that fails to be absorbed in the partition walls 113a, 113b, and 113c and is transmitted among light emitted toward the partition walls 113a, 113b, and 113c, the partition walls 113a, 113b, and 113c may include pigments of a color other than the color of the color filters 202R, 202G, and 202B arranged at both sides on the basis of the partition walls 113a, 113b, and 113c. For example, the partition wall 113b arranged between the red color filter 202R and the green color filter 202G may contain blue pigments, the partition wall 113c arranged between the green color filter 202G and the blue color filter 202B may contain red pigments, and the partition wall 113a arranged between the blue color filer 202B and the red color filter 202R may contain green pigments.

For example, as illustrated in FIG. 2, light that is emitted toward the partition wall 113b among white light emitted from the intermediate layer 122 corresponding to the red sub-pixel area may be mostly absorbed in the partition wall 113b, but light that fails to be absorbed in the partition wall 113b may pass through the partition wall 113b and become blue light. However, according to an embodiment, the color filters 202R and 202G arranged at both sides of the partition wall 113b do not transmit blue light, and thus the blue light may not be emitted toward the external side.

Likewise, since respective partition walls 113a, 113b, and 113c contain pigments, a little amount of light that fails to be absorbed in the partition walls 113a, 113b, and 113c may be prevented from being viewed from the external side, and thus light having a color other than colors of the sub-pixel areas is prevented from being emitted to an external side and color purity at each sub-pixel area may be enhanced.

Figure 3:
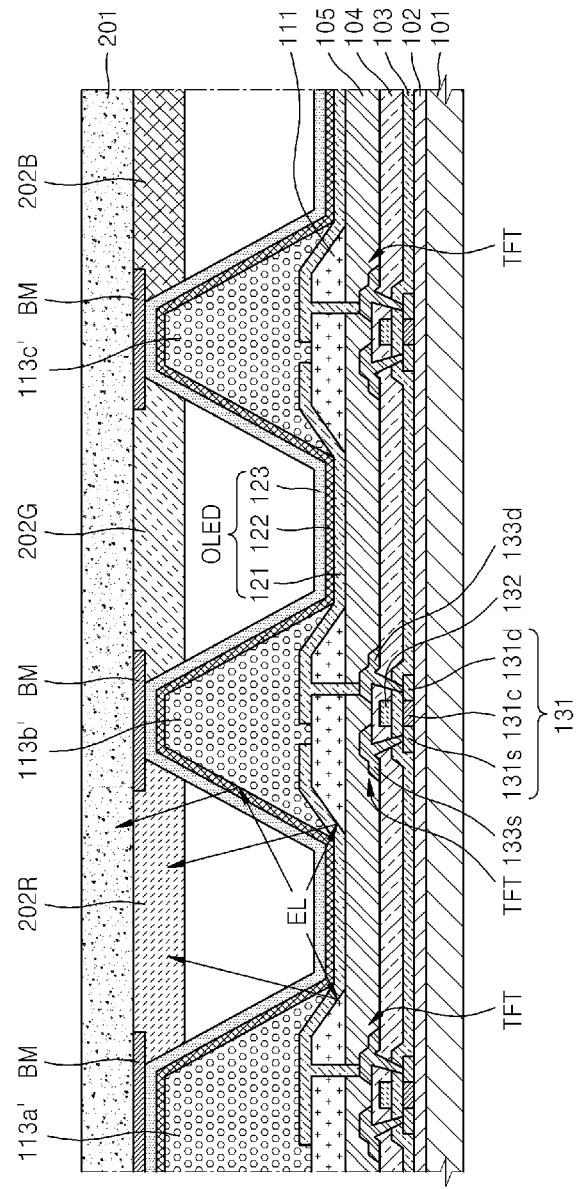
FIG. 3 is a cross-sectional diagram schematically illustrating an organic white light emitting display apparatus according to another embodiment.

FIG. 3 is a cross-sectional diagram schematically illustrating an organic white light emitting display apparatus (hereinafter, referred to as "display apparatus") according to another embodiment.

The display apparatus according to the present embodiment includes a first substrate 101 including a plurality of sub-pixel areas, an organic light emitting device (OLED) formed for each sub-pixel area, and a second substrate 201 including red, green, and blue color filters 202R, 202G, and 202B formed on positions corresponding to respective sub-pixel areas.

Furthermore, partition walls 113a', 113b', and 113c' are extended toward areas between neighboring color filters 202R, 202G, and 202B, the second electrode 123 is formed on the partition walls 113a', 113b', and 113c', the first electrode 121 is formed on the first pixel defined layer 111 having an inclined surface so that the peripheral part of the first electrode 121 includes an inclined surface, and the partition walls 113a', 113b', and 113c' contain pigments as described with reference to FIGS. 1 and 2.

The description will focus on the differences with the description of FIGS. 1 and 2.

In the display apparatus according to the present embodiment, the second pixel defined layer and the partition walls 113a', 113b', and 113c' may be integrally formed. In this case, the intermediate layer 122 and the second electrode 123 may be formed on the partition walls 113a', 113b', and 113c'.

First, an opening is formed so that the peripheral part of the first pixel defined layer 111 may have an inclined surface, and the first electrode 121 is formed on the opening and the inclined surface of the first pixel defined layer 111. The peripheral part of the first electrode 121 is formed on the inclined surface of the first pixel defined layer 111, and thus light, which is emitted in a horizontal direction, e.g., toward the first pixel defined layer 111 among white light emitted from the intermediate layer 122, may be reflected in the inclined surface of the first electrode 121 to be emitted toward the second substrate 201, as described with reference to FIG. 2.

Next, the partition walls 113a', 113b', and 113c' extended toward the areas between the color filters 202R, 202G, and 202B are formed. The partition walls 113a', 113b', and 113c' are interposed between the neighboring sub-pixel areas to spatially separate the pixels and prevent light emitted from each sub-pixel area from being emitted toward the adjacent sub-pixel areas. The partition walls 113a', 113b', and 113c' may comprise one or more organic material selected from a group composed of polyimide, polyamide, acrylic resin, benzocyclobutene, and phenol resin. Thereafter, the intermediate layer 122 and the second electrode 123 are formed on the partition walls 113a', 113b', and 113c'.

Furthermore, some of light emitted from the OLED is reflected to be emitted toward the color filters 202R, 202G, and 202B by the second electrode 123 formed on the partition walls 113a', 113b', and 113c', and the partition walls 113a', 113b', and 113c' contain pigments in order to prevent light that fails to be absorbed in the partition walls 113a', 113b', and 113c' and transmits the partition walls 113a', 113b', and 113c' from being viewed from the external side, as described above.

According to an embodiment, partition walls that entirely or partially surround respective sub-pixels are formed, and thus light emitted from one sub-pixel may be prevented from entering an adjacent sub-pixel, light may be prevented from being emitted through other sub-pixels when one sub-pixel is turned on, and color purity of light emitted from each sub-pixel area may be enhanced.

Furthermore, the first electrode is formed to have an inclined surface, and thus light collecting efficiency may be enhanced.

While the present embodiments have been particularly shown and described with reference to example embodiments thereof, it will be understood by those of ordinary skill in the art that various changes in form and details may be made therein without departing from the spirit and scope of the present embodiments as defined by the following claims.

What is claimed is:

1. An organic white light emitting display apparatus comprising:
    a first substrate including a first sub-pixel area, a second sub-pixel area, a third sub-pixel area, wherein an organic light emitting device (OLED) is formed in each sub-pixel area, the OLED includes a first electrode, a second electrode, and an organic white light emitting layer interposed between the first and second electrodes configured to emit white light;
    a second substrate facing the first substrate and including first, second, and third color filters of different colors and black matrix between neighboring color filters, wherein the first, second, and third color filters are corresponding to the respective sub-pixel areas;
    a partition wall formed on the first substrate; and
    a first pixel defined layer disposed below the partition wall;
    wherein the partition wall extends toward the black matrix and partitions the sub-pixel areas, and
    wherein the first electrode is disposed over the first pixel defined layer such that i) a part of the first electrode and the organic white light emitting layer are disposed within an opening defined in the first pixel defined layer and ii) a peripheral part of the first electrode is disposed over an inclined surface of the first pixel defined layer surrounding the opening, and at least a portion of the peripheral part of the first electrode is between the first pixel defined layer and the partition wall.

2. The organic white light emitting display apparatus of claim 1, wherein the second electrode of the OLED is formed on the partition wall.

3. The organic white light emitting display apparatus of claim 1, wherein the second substrate includes a black matrix formed between the neighboring color filters.

4. The organic white light emitting display apparatus of claim 1, wherein the partition wall comprises a pigment of a color other than colors of color filters arranged at both sides on the basis of the partition wall.

5. The organic white light emitting display apparatus of claim 4, wherein a partition wall arranged between the first color filter and the second color filter comprises a pigment of the third color, a partition wall arranged between the second color filter and the third color filter comprises a pigment of the first color, and a partition wall arranged between the third color filter and the first color filter comprises a pigment of the second color.

6. The organic white light emitting display apparatus of claim 1, wherein the first color is red, the second color is green, and the third color is blue.

7. The organic white light emitting display apparatus of claim 1, further comprising:
    a thin film transistor (TFT) formed on the first substrate;
    a planarization layer formed on the TFT; and a second pixel defined layer between the first pixel defined layer and the partition wall.

8. The organic white light emitting display apparatus of claim 7, wherein the partition wall is formed on the second pixel defined layer.

9. The organic white light emitting display apparatus of claim 8, wherein the partition wall and the second pixel defined layer are integrally formed.

10. The organic white light emitting display apparatus of claim 7, wherein the second pixel defined layer covers the first electrode formed on the inclined surface of the first pixel defined layer.

11. An organic white light emitting display apparatus comprising:
   a first substrate including red, green, and blue sub-pixel areas;
   a second substrate facing the first substrate and including red, green, and blue color filters formed at positions corresponding to the sub-pixel areas;
   a pixel defined layer formed on the first substrate, wherein the pixel defined layer defines the sub-pixel areas;
   a partition wall formed on the pixel defined layer, extending toward the second substrate and partitioning the sub-pixel areas;
   a first electrode formed on the first substrate and positioned for each of the sub-pixel areas;
   an intermediate layer formed on the first electrode and including an organic white light emitting layer; and
   a second electrode formed on the intermediate layer and the partition wall,
   wherein the first electrode is disposed over the pixel defined layer such that i) a part of the first electrode and the intermediate layer are disposed within an opening defined in the pixel defined layer and ii) a peripheral part of the first electrode is disposed over an inclined surface of the pixel defined layer surrounding the opening, and at least a portion of the peripheral part of the first electrode is between the pixel defined layer and the partition wall.

12. The organic white light emitting display apparatus of claim 11, wherein the partition wall comprises a pigment of a color other than colors of color filters arranged at both sides on the basis of the partition wall.

13. The organic white light emitting display apparatus of claim 11, wherein a partition wall between the red color filter and the green color filter comprises a blue pigment, a partition wall between the green color filter and the blue color filter comprises a red pigment, and a partition wall between the blue color filter and the red color filter comprises a green pigment.

14. The organic white light emitting display apparatus of claim 11, further comprising:
   a thin film transistor (TFT) formed on the first substrate;
   a planarization layer formed on the TFT and below the pixel defined layer; and
   a first pixel defined layer formed on the planarization layer; and
   a second pixel defined layer between the pixel defined layer and the partition wall.

15. The organic white light emitting display apparatus of claim 11, wherein the first electrode includes reflective metal.

16. The organic white light emitting display apparatus of claim 14, wherein the partition wall is formed on the second pixel defined layer.

17. The organic white light emitting display apparatus of claim 16, wherein the partition wall and the second pixel defined layer are integrally formed.

18. The organic white light emitting display apparatus of claim 11, wherein the second substrate further includes a black matrix between the neighboring color filters.

19. The organic white light emitting display apparatus of claim 18, wherein an upper part of the partition wall is arranged to correspond to the black matrix.

20. The organic white light emitting display apparatus of claim 11, wherein the second electrode has translucency and reflexibility that reflects at least some light, which is emitted toward the partition wall among white light emitted from the intermediate layer, toward the second substrate.

21. The organic white light emitting display apparatus of claim 1, wherein a first distance from the first substrate to the part of the first electrode is lower than a second distance from the first substrate to the peripheral part of the first electrode.

22. The organic white light emitting display apparatus of claim 11, wherein a first distance from the first substrate to the part of the first electrode is lower than a second distance from the first substrate to the peripheral part of the first electrode.

* * * * *